United States Patent [19]

Rüsch

[11] 4,043,834
[45] Aug. 23, 1977

[54] FLEXIBLE SOLAR GENERATOR PANEL

[75] Inventor: Dieter Rüsch, Wedel, Holstein, Germany

[73] Assignee: Licentia Patent-Verwaltungs-G.m.b.H., Germany

[21] Appl. No.: 720,653

[22] Filed: Sept. 7, 1976

[30] Foreign Application Priority Data

Sept. 18, 1975 Germany ............................. 2541536

[51] Int. Cl.² ........................................... H01L 31/04
[52] U.S. Cl. ............................... 136/89 SA; 136/89 P
[58] Field of Search ............. 136/89 SA, 89 P, 89 PC

[56] References Cited

U.S. PATENT DOCUMENTS

| 3,255,047 | 6/1966 | Escoffery | 136/89 |
| 3,411,050 | 11/1968 | Middleton et al. | 317/234 |
| 3,533,030 | 1/1971 | Lebrun | 136/89 |
| 3,565,719 | 2/1971 | Webb | 156/212 |
| 3,819,417 | 6/1974 | Haynos | 136/89 |

Primary Examiner—John H. Mack
Assistant Examiner—Aaron Weisstuch
Attorney, Agent, or Firm—McGlew and Tuttle

[57] ABSTRACT

A solar generator panel for satellite and terrestrial energy supply systems comprises a flexible support having a plurality of solar cells mounted on the support and being rollable and foldable therewith. Connector means are provided for electrically interconnecting the cells in either parallel or series. At least one conducting layer is applied to the opposite side of the support from the solar cells and is adapted to be grounded to the associated satellite or to the earth for the purpose of eliminating charged carriers. The back of the assembly is advantageously provided with a layer of adhesive mixed with electrically conducting particles and particularly silver powder particles which serve to connect the solar cells through to the satellite. The proportion of the electrically conductive particles in the adhesive layer is preferably about 50%.

6 Claims, 2 Drawing Figures

FLEXIBLE SOLAR GENERATOR PANEL

BACKGROUND OF THE INVENTION

1. Field of the Invention

This invention relates in general to the construction of a solar generator for a satellite or terrestrial energy system and in particular to a new and useful solar cell having a flexible support mounting a plurality of cells which are interconnected electrically so that the structure may be rollable or foldable and which also includes a conductive layer applied to the opposite side of the support for the elimination of charge carriers.

2. Description of the Prior Art

Solar generators are used for energy generation on the earth and at or on satellites and the radiant energy of the sun is transformed by photoelectric means into electrical energy. The solar generators used in space travel technology are increasingly designed in a flexible form. It is therefore possible to apply the generator in or on the satellite in a rolled up, a flapped or folded state and to extend the support only in orbit, that is, in the operative position of the satellite, by means of special devices. The accommodation of the solar generator thus requires relatively little space during the take-off phase of the satellite. However, a disadvantage in these solar generators as in all other solar generators used in space travel and on earth, is that high static charges may occur on the back of the supports for the solar cells. Also a high potential difference may occur between the front and the back surfaces and discharges may thus lead to damage of such a generator.

SUMMARY OF THE INVENTION

In accordance with the present invention there is provided a solar generator where the back of the solar cell support carries a conductive layer so that the formation of high static charges or potential differences is avoided to the extent that the existing static charges or potential differences are eliminated by connecting them to the satellite body or to the ground.

In accordance with the invention one or more electrically conductive layers are applied on the back of the solar generator assembly preferably by gluing or by the use of adhesive containing individual conductive elements and this conductive layer is in electrical conduction with the satellite or the ground for the elmination of the charge carriers through the satellite or the ground respectively. The electrically conductive layer may also serve to connect solar cells through to the satellite.

In accordance with the invention the back side of the solar generator is provided with an adhesive layer mixed with electrically conductive particles, in particular silver powder particles, and it is electrically connected with the satellite for the elimination of the charge carriers or in the case of a terrestrial energy supply system it is grounded. With such an arrangement high potential differences are avoided.

The adhesive which may be employed is any adhesive which will adhere well to the solar cell support and withstand the special stresses of the orbit of a satellite as well as any stresses on earth and may for example be a polyester adhesive No. 46971 of a type sold by E. I. Du Pont and Company. The proportion of the electrically conductive particles in the adhesive layer should be about 50%.

An advantage of the invention is that the electrically conductive layers can easily be applied on the back of the solar generator, in particular on a large area solar generator without any technical difficulties. This can be done in a final operation after completion of the remaining portion of the generator. Another advantage lies in the technical simplicity of the discharge arrangement or of the wiring technology whereby the installation and manufacturing costs can be maintained very low.

Accordingly, it is an object of the invention to provide a solar generator for satellite and terrestrial energy supply systems which comprises a flexible support with a plurality of solar cells mounted on the support and which are preferably rollable and foldable therewith and which also includes connector means for interconnecting the cells and at least one conducting layer on the rear side of the structure which is adapted to be grounded or connected to the satellite in order to eliminate charge carriers.

A further object of the invention is to provide a solar generator which is simple in design, rugged in construction and econmical to manufacture.

GENERAL DESCRIPTION OF THE PREFERRED EMBODIMENT

Figure 1:
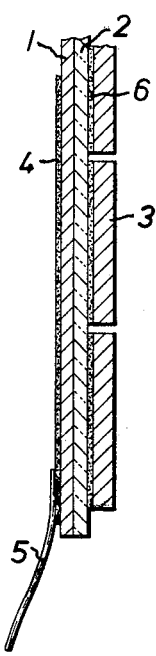
FIG. 1 is a partial sectional view of a solar cell assembly constructed in accordance with the invention.
Figure 2:
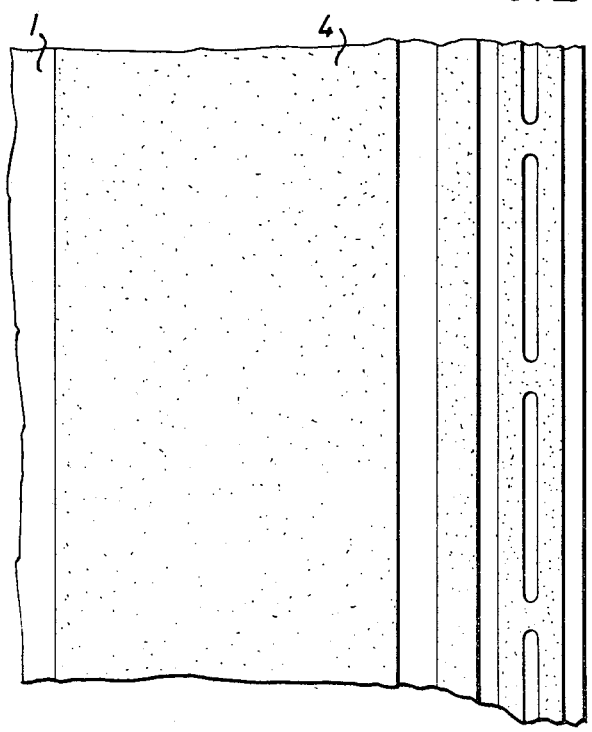
FIG. 2 is a partial rear view of the solar cell shown in FIG. 1.

Referring to the drawings in particular the invention embodied therein comprises a solar cell which includes a support, which for example, comprises a Kapton layer 1 of a thickness of about 12.5 microns which is reinforced by a glass fiber layer 2 of a thickness of about 35 microns. The glass fiber or glass silk layer 2 forms the front of the solar cell support and a plurality of solar cells 3 are arranged on the support and they are electrically interconnected by connector means 6 in either series and/or parallel. On the back of the cell support is applied a layer 4 which comprises an adhesive and electrically conductive particles. The layer 4 is conductive and it is connected to the satellite through an electric junction element 5 which extends to the satellite or for terrestrial use may be grounded. Instead of the composite layer of adhesive and conductive particles a conductive layer may be applied to the back of the support by adhesive or gluing.

The whole assembly is advantageously foldable or flexible and the layer 4 advantageously includes an electrically conductive particle content which is about 50% of the total content. The conductive layer 4 insures that high static charges and potential differences are avoided to a great extent and that any existing static charges and potential differences are immediately eliminated through the electrically conductive layers 4 and the electrical junction element 5 to the satellite body or to the ground. The possibility also exists for carrying out electrical wiring of the solar cells to the satellite through the individually applied conductive adhesive layers which may be made in the form of the layers 6.

While a specific embodiment of the invention has been shown and described in detail to illustrate the application of the principles of the invention, it will be understood that the invention may be embodied otherwise without departing from such principles.

What is claimed is:

1. A solar generator for satellite and terrestrial energy supply systems, comprising a flexible support, a plurality of solar cells mounted on said support and being rollable and foldable therewith, connector means electrically interconnecting said cells, and at least one conducting layer adapted to be grounded to the associated satellite or to the earth and applied to said support on the side opposite said cells for elimination of charge carriers.

2. A solar generator according to claim 1, wherein said conductive layer comprises a mixture of adhesive and conductive particles.

3. A solar generator according to claim 2, wherein said conductive layer comprises electrically conductive silver powder particles.

4. A solar generator according to claim 1, wherein said connector means comprises an electrically conductive layer.

5. A solar generator according to claim 1, wherein said conducting layer comprises an adhesive and conductive particles in an amount of about 50% of the total content.

6. A solar generator according to claim 1, wherein said conducting layer comprises at least one conductive layer applied to the back of said support by adhesive.

* * * * *